(12) United States Patent
Yamanaka et al.

(10) Patent No.: US 10,283,692 B2
(45) Date of Patent: May 7, 2019

(54) POWER GENERATION SYSTEM

(71) Applicants: DAIHATSU MOTOR CO., LTD., Ikeda-shi, Osaka (JP); NATIONAL UNIV. CORP. NAGAOKA UNIVERSITY OF TECH., Nagaoka-shi, Niigata (JP)

(72) Inventors: Satoru Yamanaka, Shiga (JP); Yoonho Kim, Shiga (JP); Takashi Ogawa, Shiga (JP); Akira Nakajima, Shiga (JP); Juyoung Kim, Shiga (JP); Hirohisa Tanaka, Shiga (JP); Tadachika Nakayama, Nagaoka (JP); Masatoshi Takeda, Nagaoka (JP); Noboru Yamada, Nagaoka (JP); Koichi Niihara, Nagaoka (JP)

(73) Assignees: DAIHATSU MOTOR CO., LTD., Osaka (JP); NATIONAL UNIVERSITY CORPORATION NAGAOKA OF TECHNOLOGY, Niigata (JP)

( * ) Notice: Subject to any disclaimer, the term of this patent is extended or adjusted under 35 U.S.C. 154(b) by 330 days.

(21) Appl. No.: 15/037,395

(22) PCT Filed: Nov. 20, 2014

(86) PCT No.: PCT/JP2014/080830
§ 371 (c)(1),
(2) Date: May 18, 2016

(87) PCT Pub. No.: WO2015/076351
PCT Pub. Date: May 28, 2015

(65) Prior Publication Data
US 2016/0284964 A1    Sep. 29, 2016

(30) Foreign Application Priority Data

Nov. 22, 2013 (JP) ................................. 2013-241562
Nov. 22, 2013 (JP) ................................. 2013-241757

(51) Int. Cl.
*F01N 5/02* (2006.01)
*H01L 35/30* (2006.01)
(Continued)

(52) U.S. Cl.
CPC ................. *H01L 35/32* (2013.01); *F01N 5/02* (2013.01); *H01L 35/30* (2013.01); *H01L 37/02* (2013.01); *Y02T 10/16* (2013.01)

(58) Field of Classification Search
CPC ......... H01L 35/32; H01L 35/30; H01L 37/02; F01N 5/02; Y02T 10/16
(Continued)

(56) References Cited

U.S. PATENT DOCUMENTS 5,997,292 A      12/1999  Tanaka et al.
8,916,104 B2 *   12/2014  Lee .................... B01D 53/8631
                                                          422/180

(Continued)

FOREIGN PATENT DOCUMENTS

DE      19805184 A1     8/1999
JP      2005-117835 A   4/2005
(Continued)

OTHER PUBLICATIONS

Extended European Search Report dated Nov. 7, 2017, issued by the European Patent Office in corresponding European Application No. 14864623.5. (8 pages).
(Continued)

*Primary Examiner* — Forrest M Phillips
(74) *Attorney, Agent, or Firm* — Buchanan Ingersoll & Rooney PC

(57) ABSTRACT

A power generation system includes: a heat source having a temperature being changed over time; a flow passage
(Continued)

through which a heat medium heated by the heat source passes; a power generation device including a power generation element and a first electrode, the power generation element being electrically polarized by temperature change thereof depending on temperature change of the heat medium, the first electrode extracting electric power from the power generation element; a temperature detection device being disposed on an upstream side relative to the power generation device in the flow passage and detecting the temperature of the heat medium; a voltage application device that applies voltage to the power generation element; and a control device that activates the voltage application device when the temperature increase of the heat medium has been detected and deactivates the voltage application unit when the temperature decrease of the heat medium has been detected.

1 Claim, 7 Drawing Sheets

(51) Int. Cl.
  *H01L 35/32*    (2006.01)
  *H01L 37/02*    (2006.01)

(58) Field of Classification Search
  USPC ........................................................ 310/306
  See application file for complete search history.

(56) References Cited

U.S. PATENT DOCUMENTS

| | | | |
|---|---|---|---|
| 8,946,538 B2* | 2/2015 | Erbil | H01L 37/02 |
| | | | 136/201 |
| 9,190,597 B2 | 11/2015 | Kim et al. | |
| 2003/0111933 A1 | 6/2003 | Gallmeyer | |
| 2007/0045044 A1* | 3/2007 | Sullivan | F01N 1/02 |
| | | | 181/268 |
| 2011/0163636 A1 | 7/2011 | Sirbuly et al. | |
| 2011/0308560 A1* | 12/2011 | Arbuckle | F01N 5/025 |
| | | | 136/205 |
| 2013/0002091 A1* | 1/2013 | Kim | H01L 37/02 |
| | | | 310/306 |
| 2015/0001989 A1 | 1/2015 | Kim et al. | |
| 2016/0326932 A1* | 11/2016 | Karl | H01L 35/02 |
| 2017/0082000 A1* | 3/2017 | Borla | F01N 3/055 |
| 2017/0211450 A1* | 7/2017 | Sugimoto | F01N 5/025 |
| 2017/0335805 A1* | 11/2017 | Zhang | F01P 3/20 |
| 2018/0135492 A1* | 5/2018 | Rinaldi | F01N 5/025 |
| 2018/0149112 A1* | 5/2018 | Ben Ahmed | F02G 5/02 |

FOREIGN PATENT DOCUMENTS

| | | |
|---|---|---|
| JP | 2011-250675 A | 12/2011 |
| JP | 2013-090495 A | 5/2013 |
| JP | 2013-099066 A | 5/2013 |
| WO | WO 96/05474 A | 2/1996 |
| WO | WO 2013/031774 A1 | 3/2013 |

OTHER PUBLICATIONS

International Search Report (PCT/ISA/210) dated Feb. 10, 2015, by the Japanese Patent Office as the International Searching Authority for International Application No. PCT/JP2014/080830.

Written Opinion (PCT/ISA/237) dated Feb. 10, 2015, by the Japanese Patent Office as the International Searching Authority for International Application No. PCT/JP2014/080830.

* cited by examiner

POWER GENERATION SYSTEM

TECHNICAL FIELD

The present invention relates to a power generation system.

BACKGROUND ART

Conventional energy using devices including internal-combustion engines for automobiles, boilers, heat exchangers used for air-conditioning equipment, power generators, electric mechanisms such as motors, and light-emitting devices such as illuminators release or lose much thermal energy as waste heat, light, or the like.

In recent years, from the viewpoint of energy saving, it has been required to collect the released thermal energy and reuse such energy as the energy source. As such a system, a power generation system has been suggested. Specifically, this power generation system includes, for example, a heat source of which temperature is increased or decreased over time, a first device, and a second device. The first device (such as a dielectric) is electrically polarized by the piezo effect, the pyroelectric effect, the Seebeck effect, or the like in accordance with the temperature change of the heat source. The second devices (such as electrodes) are disposed opposite to each other with the first device interposed therebetween in order to extract electric power from the first device. Moreover, mounting the power generation system in an automobile or the like and moreover, in such a case, having the first device (such as a dielectric) in an exhaust pipe to which the exhaust gas of the automobile is supplied have been suggested (see, for example, Patent Literature 1).

For more efficient power generation of such a power generation system, applying voltage to the first device in accordance with the temperature condition of the first device has been examined.

Specifically, for example, the temperature of the first device is detected by the temperature sensor (such as a thermocouple or a thermistor) and upon the detection of the temperature increase in the temperature sensor, the voltage is applied to the first device.

However, the responsiveness to the temperature change is different between the temperature sensor and the dielectric as the first device. Thus, when the voltage is applied to the first device on the basis of the temperature detected by the temperature sensor, the responsiveness of the applied voltage relative to the temperature detection is not sufficient. For the higher power generation efficiency, the higher responsiveness may be required.

In the power generation system, the higher power generation efficiency is attempted by stopping the voltage application at the timing when the temperature of the first device has decreased.

On the other hand, further higher power generation efficiency of the power generation system has been required.

CITATION LIST

Patent Literature

PATENT LITERATURE 1: JP-A-2011-250675

SUMMARY OF INVENTION

Problems to be Solved by the Invention

An objective of the present invention is to provide a power generation system with higher power generation efficiency.

Solutions to the Problems

In order to achieve the above-described objective, a power generation system according to a first aspect of the present invention includes: a heat source having a temperature being increased or decreased over time; a flow passage through which a heat medium heated by the heat source passes; a power generation device including a power generation element and a first electrode, a temperature of the power generation element being increased or decreased over time depending on temperature change of the heat medium, the power generation element being electrically polarized by the temperature increase or decrease thereof, the power generation element including a dielectric with the Curie point, the first electrode extracting electric power from the power generation element; a temperature detection unit that is disposed on an upstream side relative to the power generation device in the flow passage and detects a temperature of the heat medium passing through the flow passage; a voltage application unit that applies voltage to the power generation element; and a control unit that activates the voltage application unit when the temperature detection unit has detected a temperature increase of the heat medium and deactivates the voltage application unit when the temperature detection unit has detected a temperature decrease of the heat medium. The temperature detection unit includes: a temperature detection element, a temperature of the temperature detection element being increased or decreased over time depending on the temperature change of the heat medium, the temperature detection element being electrically polarized by the temperature increase or decrease thereof, the temperature detection element including a dielectric with the Curie point that is more than or equal to a temperature 50° C. lower than the Curie point of the power generation element; and a second electrode that detects electric polarization of the temperature detection element by detecting an electromotive force from the temperature detection element.

In order to achieve the above-described objective, a power generation system according to a second aspect of the present invention includes: a heat source having a temperature being increased or decreased over time; a first device having a temperature being increased or decreased over time depending on temperature change of the heat source and being electrically polarized; a second device that extracts electric power from the first device; a voltage application unit that applies voltage to the first device; a prediction unit that predicts a cycle of temperature change of the first device; and a control unit that activates or deactivates the voltage application unit on the basis of the prediction of the prediction unit. In the cycle of the temperature change of the first device that is predicted by the prediction unit, the control unit activates the voltage application unit at a timing of −15% or more and less than 0% of the cycle from predicted start time of temperature increase and deactivates the voltage application unit at a timing of −15% or more and less than 0% of the cycle from predicted start time of temperature decrease.

Advantageous Effects of the Invention

In the power generation system according to the first aspect of the present invention, the dielectric with the Curie point that is more than or equal to the temperature 50° C. lower than the Curie point of the power generation element is used as the temperature detection element. This makes it possible for the power generation element and the temperature detection element to have the same or similar responsiveness to the temperature change.

Thus, the voltage can be applied to the power generation element with high responsiveness in accordance with the temperature change of the power generation element.

With the use of the power generation system as above, the energy can be extracted efficiently from the power generation element and the higher power generation efficiency can be achieved.

In the power generation system according to the second aspect of the present invention, the voltage application unit is activated at a timing of −15% or more and less than 0% of the cycle of the temperature change of the first device from the predicted start time of the temperature increase and the voltage application unit is deactivated at a timing of −15% or more and less than 0% of the cycle from the predicted start time of the temperature decrease.

That is to say, in the power generation system according to the second aspect of the present invention, the voltage application unit is activated at a timing earlier by a predetermined period than the predicted start time of the temperature increase (−15% or more and less than 0% of the period of one temperature change cycle). In addition, the voltage application unit is deactivated at a timing earlier by a predetermined period than the predicted start time of the temperature decrease (−15% or more and less than 0% of the period of one temperature change cycle).

By activating and deactivating the voltage application unit at the aforementioned timing, the electric power can be extracted efficiently from the first device, and the power generation efficiency can be improved. The objective, features, aspects, and advantageous effect of the present invention will be made apparent based on the following description and the attached drawings.

DESCRIPTION OF EMBODIMENTS

1. Structure of Automobile

Figure 1:
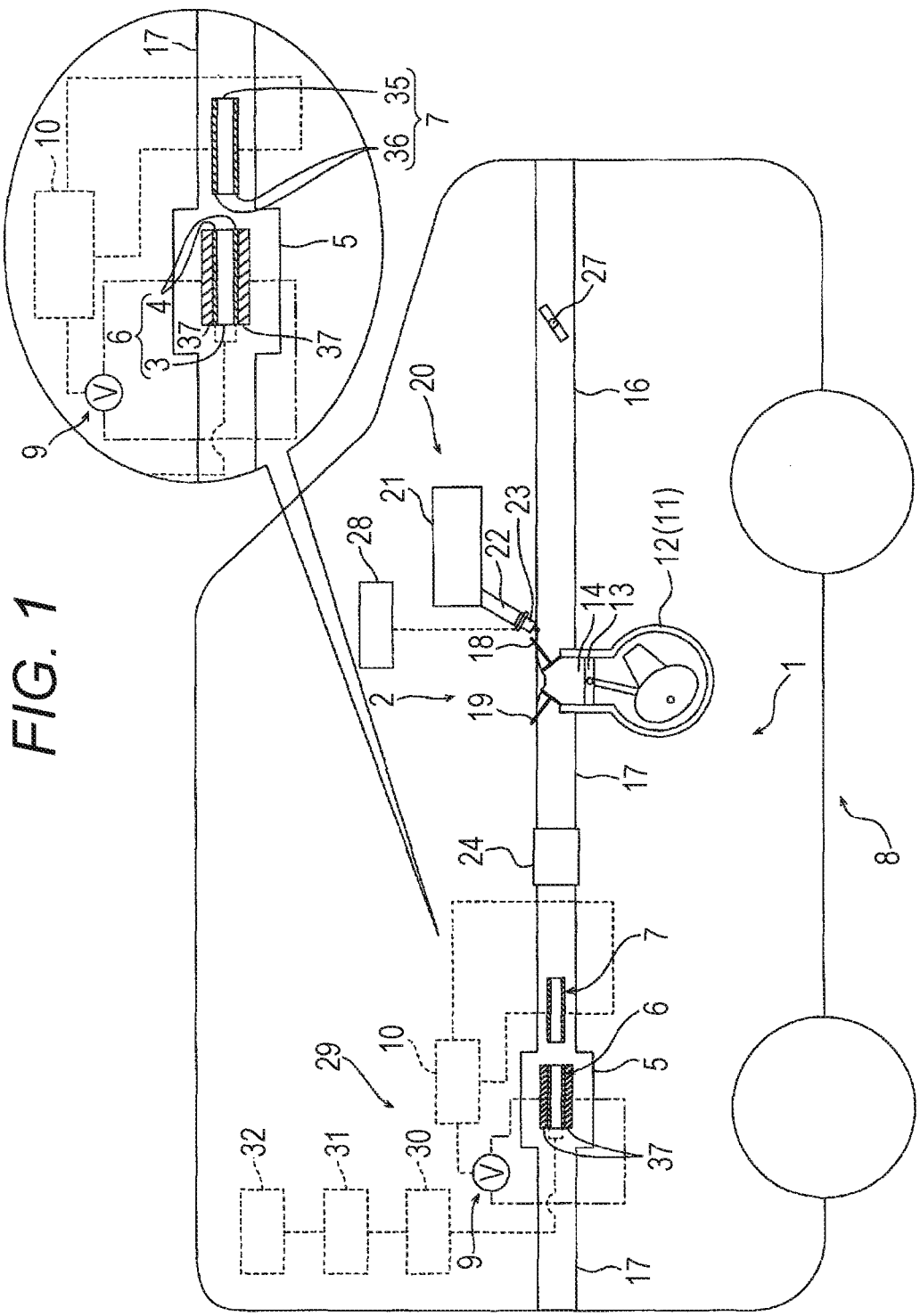
FIG. 1 is a schematic structure view illustrating an example in which a power generation system according to one embodiment of the present invention is mounted in an automobile.

FIG. 1 is a schematic structure view illustrating one embodiment of a power generation system according to the present invention.

In FIG. 1, an automobile 8 includes a power system 2 and an energy collection system 29.

The power system 2 includes an engine 11 as a heat source of which temperature is increased or decreased over time, an intake pipe 16 through which air is supplied to the engine 11, an exhaust pipe 17 as a flow passage through which the exhaust gas as a heat medium heated by the engine 11 passes, and a fuel supply device 20 from which fuel is supplied to the engine 11.

The engine 11 is a device generating a power. The engine 11 may be, for example, a single cylinder type or a multi-cylinder type (for example, two-cylinder type, four-cylinder, type, or six-cylinder type). Each cylinder may be a multi-cycle type (for example, two-cycle type, four-cycle type, or six-cycle type).

The engine 11 to be described below is the four-cylinder type, each cylinder having the four cycles.

This engine 11 is provided with a plurality of (four) cylinders 12 arranged in parallel to each other. FIG. 1 illustrates one cylinder 12, and the other cylinders 12 are not illustrated.

Each cylinder 12 includes a piston 13, a combustion chamber 14, an ignition plug (not shown), and the like. Each cylinder 12 has an upstream side connected to the intake pipe 16 and a downstream side connected to the exhaust pipe 17.

Each cylinder 12 includes an intake valve 18 in a connection portion thereof that is connected to the intake pipe 16. In addition, each cylinder 12 includes an exhaust valve 19 in a connection portion thereof that is connected to the exhaust pipe 17.

The intake valve 18 is provided in the portion connecting between the cylinder 12 and the intake pipe 16 in a manner of being capable of opening or closing the cylinder 12.

The exhaust valve 19 is provided in the portion connecting between the cylinder 12 and the exhaust pipe 17 in a manner of being capable of opening or closing the cylinder 12.

The intake valve 18 and the exhaust valve 19 are energized in the closing direction by the elastic force of a spring or the like, which is not shown. These intake value 18 and exhaust valve 19 can open or close the cylinder 12 by the rotation of a camshaft, for example.

The intake pipe 16 is provided to supply air to the engine 11. The intake pipe 16 has its downstream end connected to the cylinder 12 of the engine 11 and its upstream end open to the external air.

The intake pipe 16 is provided with a throttle valve 27. The opening/closing and the opening degree of the throttle valve 27 can be adjusted by the operation of, for example, treading on the accelerator pedal. By opening or closing the throttle valve 27, the air can be taken into the engine 11.

The exhaust pipe 17 is provided to discharge the exhaust gas out of the engine 11, and has its upstream end connected to the cylinder 12 of the engine 11.

Although not shown, the plurality of (four) exhaust pipes 17 connected to the plurality of (four) cylinders 12 is collected into one at a predetermined position. On the downstream side of the collected exhaust pipes 17, a catalyst placement portion 24 and a box-shaped container 5 are disposed.

The catalyst placement portion 24 includes, for example, a catalyst carrier and a catalyst applied on the carrier. The catalyst placement portion 24 is connected to a middle part of the exhaust pipe 17 in the exhaust gas flowing direction in order to clean the harmful components included in the exhaust gas discharged from the engine 11, such as hydrogen carbide (HC), nitrogen oxide (NOx), or carbon monoxide (CO).

The box-shaped container 5 is a container with an approximately rectangular parallelepiped shape, and is inserted into the middle of the exhaust pipe 17 more on the downstream side than the catalyst placement portion 24 in the flowing direction so as to communicate with the exhaust pipe 17. The exhaust gas flows in the space inside the box-shaped container 5.

On the downstream side of the box-shaped container 5, the downstream end of the exhaust pipe 17 is open to the external air. Thus, the exhaust gas discharged from the engine 11 can be released to the external air.

The fuel supply device 20 includes a fuel tank 21 and a fuel supply pipe 22.

The fuel tank 21 is a tank storing fuel to be supplied to the engine 11 (such as gasoline). The fuel tank 21 is formed of, for example, heat-resistant pressure-resistant container.

The fuel supply pipe 22 is provided to supply fuel from the fuel tank 21 to the engine 11. The fuel supply pipe 22 has its upstream end connected to the fuel tank 21 and its downstream end connected to a fuel injection valve 23.

The fuel injection valve 23 is a valve that adjusts the amount of fuel to be supplied from the fuel tank 21 to the engine 11 and injects the fuel to the engine 11. The fuel injection valve 23 is provided at the downstream end of the fuel supply pipe 22 and more on the upstream side of the intake pipe 16 than the intake valve 18.

There is no particular limitation on the fuel injection valve 23 and a known injection valve can be used.

The fuel injection valve 23 is electrically connected to an engine control unit 28 of the engine 11. With the engine control unit 28, the opening/closing of the fuel injection valve 23 is controlled.

The engine control unit 28 is a unit that controls the amount of fuel to be supplied on the basis of the operation state of the engine 11 (for example, the engine speed of the engine 11 detected by a tachometer which is not shown, or the pressure in the intake pipe 16 on the downstream side of the throttle valve 27 detected by a pressure sensor which is not shown). The engine control unit 28 includes a microcomputer including a CPU, a ROM, a RAM, and the like.

Electrically connecting the fuel injection valve 23 to the engine control unit 28 enables the control signal from the engine control unit 28 to be input to the fuel injection valve 23. This allows the engine control unit 28 to control the opening/closing and the opening degree of the fuel injection valve 23, i.e., the amount of fuel to be injected by the fuel injection valve 23 (amount of fuel supplied to the engine 11) in accordance with the operation state of the engine 11.

The energy collection system 29 includes a power generation device 6, a temperature detection device 7 as a temperature detection unit, a voltage application device 9 as a voltage application unit, and a control device 10 as a control unit. The power generation device 6 includes a power generation element 3 and first electrodes 4. The temperature of the power generation element 3 is increased or decreased over time as the temperature of the exhaust gas changes. The first electrode 4 extracts electric power from the power generation element 3. The temperature detection device 7 detects the temperature of the exhaust gas flowing in the exhaust pipe 17. The voltage application device 9 applies voltage to the power generation device 6. The control device 10 activates the voltage application device 9 upon the detection of the temperature increase of the exhaust gas by the temperature detection device 7. The control device 10 deactivates the voltage application device 9 upon the detection of the temperature decrease of the exhaust gas.

The power generation device 6 is disposed in the box-shaped container 5.

Along with the reception of the exhaust gas which is discharged from the engine 11 and of which temperature is increased or decreased over time, the power generation element 3 has its temperature increased or decreased over time and is therefore electrically polarized.

Here, the electric polarization is defined as the phenomenon that the dielectric polarization occurs due to the displacement of positive and negative ions caused by the crystal strain to produce the potential difference, for example, the piezo effect and/or the phenomenon that the dielectric constant changes due to the temperature change to produce the potential difference, for example the phenomenon that the electromotive force is caused in the material, such as the pyroelectric effect.

A specific example of the power generation element 3 is an element that is electrically polarized by the piezo effect or an element that is electrically polarized by the pyroelectric effect.

The piezo effect is the effect (phenomenon) that the electric polarization occurs in accordance with the amount of the applied stress or strain.

The power generation element 3 that is electrically polarized by the piezo effect may be any known piezo element (piezoelectric element) without a particular limitation.

If the piezo element is used as the power generation element 3, for example, the piezo element is disposed in the box-shaped container 5 with the periphery fixed by a fixing member so as to be in contact with (exposed to) the exhaust gas.

The fixing member is not particularly limited and may be, for example, the first electrode 4 as described below.

In such a case, the piezo element is heated or cooled as the temperature of the exhaust gas changes over time. This causes the piezo element to expand or contract.

Here, the electric polarization is caused by the piezo effect (piezoelectric effect) or the phase transformation around the Curie point. Thus, the electric power is extracted from the piezo element through the first electrode 4 and this will be described in detail below.

In such a piezo element, the electric polarization is neutralized usually when the heated state or cooled state is maintained so that the temperature is made constant (i.e., volume is made constant). The piezo element is electrically polarized again if cooled or heated afterward.

Thus, as described below, if the temperature of the exhaust gas changes over time and the high-temperature state and the low-temperature state are repeated over time, for example, the piezo element is heated and cooled over time repeatedly. In this case, the electric polarization and the neutralization of the piezo element are repeated over time.

As a result, the electric power is extracted by the first electrode 4 described below as the waveform that varies over time (for example, alternating current or pulsating current).

The pyroelectric effect is the effect (phenomenon) that the dielectric (insulator) or the like is electrically polarized in accordance with the temperature change as the dielectric is heated or cooled, and includes a first effect and a second effect.

The first effect is an effect that, when the dielectric is heated or cooled, the spontaneous polarization is caused by the temperature change and the charges are generated on the surface of the dielectric.

The second effect is an effect (piezo effect, piezoelectric effect) that, when the dielectric is heated or cooled, the crystal structure is pressure-deformed due to the temperature change and the piezoelectric polarization is caused by the stress or strain applied to the crystal structure.

The element that is electrically polarized by such a pyroelectric effect may be any known pyroelectric element without a particular limitation.

If the power generation element 3 is a pyroelectric element, the pyroelectric element is disposed in the box-shaped container 5 so as to be in contact with (exposed to) the exhaust gas.

In this case, the pyroelectric element is heated or cooled as the temperature of the exhaust gas changes over time, and is electrically polarized by the pyroelectric effect (including the first effect and the second effect). This causes the electric power to be extracted from the pyroelectric element through the first electrode 4 as described specifically below.

In such a pyroelectric element, the electric polarization is neutralized usually when the heated state or cooled state is maintained so that the temperature is made constant. The pyroelectric element is electrically polarized again if cooled or heated afterward.

If the temperature of the exhaust gas changes over time and the high-temperature state and the low-temperature state are repeated over time as described below, for example, the pyroelectric element is heated and cooled over time repeatedly. In this case, the electric polarization and the neutralization of the pyroelectric element are repeated over time.

As a result, the electric power is extracted by the first electrode 4 described below as the waveform that varies over time (for example, alternating current or pulsating current).

Such a power generation element 3 is a dielectric with the Curie point. Specific examples of the power generation element 3 include, as described above, known elements (for example, known pyroelectric elements (such as $BaTiO_3$, $CaTiO_3$, $(CaBi)TiO_3$, $BaNd_2Ti_5O_{14}$, $BaSm_2Ti_4O_{12}$, and lead zirconate titanate (PZT:$Pb(Zr,Ti)O_3$)), known piezo elements (for example, crystal ($SiO_2$)), zinc oxide (ZnO), Rochelle salt (potassium tartrate-sodium) ($KNaC_4H_4O_6$), lead zirconate titanate (PZT:$Pb(Zr,Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride (AlN), tourmaline (turmaline), and polyvinylidene fluoride (PVDF)), $K_{0.5}Na_{0.5}NbO_3$(KNN), and the like.

Any of these kinds can be used alone or two or more kinds thereof can be used in combination as the power generation element 3.

The Curie point of the power generation element 3 is, for example, −77° C. or more, preferably −10° C. or more, and for example 1300° C. or less, preferably 900° C. or less.

The relative dielectric constant of the power generation element 3 (dielectric (insulator)) is, for example, 1 or more, preferably 100 or more, and more preferably 2000 or more.

In the power generation system 1 as above, as the power generation element 3 (dielectric (insulator)) has the higher relative dielectric constant, the electric power can be extracted with higher voltage and higher energy conversion efficiency. On the other hand, if the relative dielectric constant of the power generation element 3 is less than the lower limit, the energy conversion efficiency may be low and the voltage of the electric power to be obtained may be low.

Note that the power generation element 3 (dielectric (insulator)) is electrically polarized as the temperature of the exhaust gas changes. The electric polarization may be any of the electronic polarization, ionic polarization, or orientation polarization.

For example, in the case of using the material that is polarized by the orientation polarization (such as liquid crystal material), it is expected that the power generation efficiency can be improved by changing the molecular structure of the material.

Figure 2:
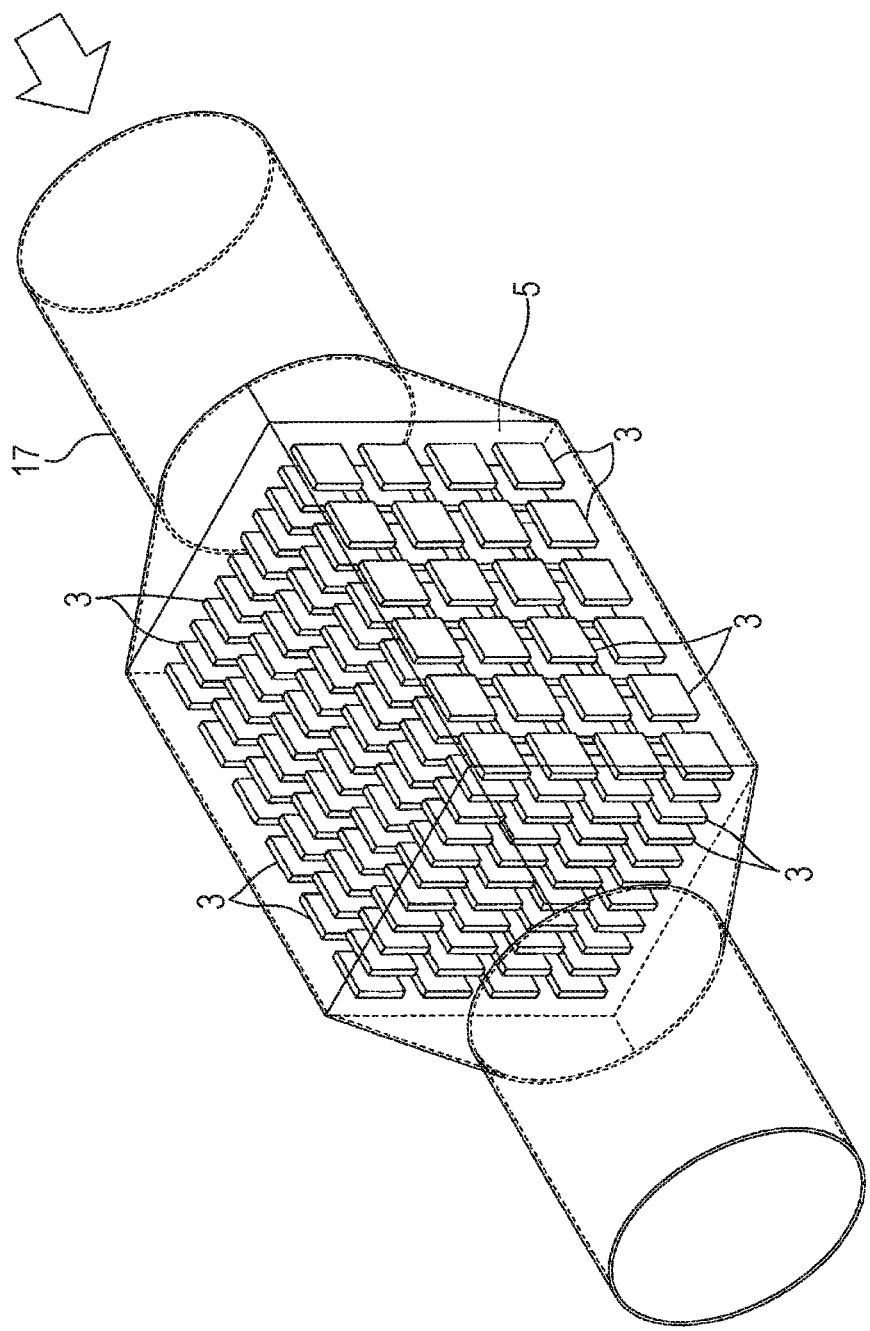
FIG. 2 is a schematic structure view illustrating a box-shaped container of the power generation system illustrated in FIG. 1.

In this case, a plurality of such power generation elements 3 is arranged at intervals in the box-shaped container 5 as illustrated in FIG. 2, for example. These power generation elements 3 are fixed by the first electrode 4 (and fixing member provided as necessary) (not shown).

Each of the plurality of power generation elements 3 is disposed in the box-shaped container 5 with its longitudinal direction coinciding with the direction where the exhaust gas flows. Each power generation element 3 can be in contact with (exposed to) the exhaust gas directly or through the first electrode 4 (described below).

In FIG. 1, one power generation element 3 (power generation device 6) is illustrated and the other power generation elements 3 (power generation devices 6) are omitted.

The first electrode 4 is provided to extract electric power from the power generation element 3.

The first electrode 4 is not particularly limited and may include, for example, two electrodes (such as copper electrodes or silver electrodes) disposed opposite to each other with the power generation element 3 interposed therebetween, and a conductive wire connected to these electrodes. The first electrode 4 is electrically connected to the power generation element 3.

The temperature detection device 7 is disposed in the exhaust pipe 17 on the upstream side relative to the box-shaped container 5 in which the power generation device 6 is disposed. The temperature detection device 7 is supported near the center of the exhaust pipe 17 through a frame, which is not shown.

Specifically, the distance between the temperature detection device 7 and the power generation element 3 (power generation device 6) is not particularly limited. For example, if the temperature of the exhaust gas from the engine 11 is changed at a cycle of 50 Hz and the flow rate thereof is 10 m/s, the temperature detection device 7 is preferably disposed in the exhaust pipe 17 on the upstream side relative to the power generation element 3 (power generation device 6) in the box-shaped container 5 at a distance of 20 cm or less from the upstream end of the power generation element 3.

The temperature detection device 7 includes a temperature detection element 35 and second electrodes 36.

The temperature detection element 35 is an element of which temperature is increased or decreased over time as receiving the exhaust gas which is discharged from the engine 11 and of which temperature is increased or decreased over time, and the temperature detection element 35 is electrically polarized as the temperature thereof changes. That is to say, the temperature detection element 35 is the aforementioned element (such as piezo element or pyroelectric element), and specifically the dielectric with the Curie point.

If the temperature detection element 35 is a piezo element, the piezo element is disposed in the exhaust pipe 17 so that the periphery thereof is fixed by the fixing member and the piezo element is in contact with (exposed to) the exhaust gas.

The fixing member is not particularly limited and may be, for example, the second electrode 36 as described below.

In this case, the piezo element is heated or cooled depending on the temperature change of the exhaust gas over time. This causes the piezo element to expand or contract.

On this occasion, the electric polarization is caused by the piezo effect (piezoelectric effect) or the phase transformation around the Curie point. Thus, the electromotive force is detected from the piezo element through the second electrode 36 as described specifically below.

In the case of using a pyroelectric element as the temperature detection element 35, the pyroelectric element is disposed in the exhaust pipe 17 so as to be in contact with (exposed to) the exhaust gas.

In this case, the pyroelectric element is heated or cooled as the temperature of the exhaust gas changes over time, and electrically polarized by the pyroelectric effect (including the first effect and the second effect). Thus, the electromotive force is detected from the pyroelectric element through the second electrode 36 as described specifically below.

The electromotive force detected from the temperature detection element 35 through the second electrode 36 is detected as the waveform that varies over time (such as alternating current or pulsating current), and this is similar to the electric power extracted from the power generation element 3 through the first electrode 4.

The temperature detection element 35 may be used alone, or two or more kinds of temperature detection elements 35 may be used in combination.

As the dielectric included in the temperature detection element 35, the dielectric shown as the examples of the dielectric included in the power generation element 3 is given. The dielectric included in the temperature detection element 35 is the same kind as the dielectric included in the power generation element 3. The Curie point of the temperature detection element 35 is, for example, −77° C. or more, preferably −10° C. or more, and for example, 1300° C. or less, preferably 900° C. or less.

Specifically, the Curie point of the dielectric included in the temperature detection element 35, which is the same kind as the dielectric included in the power generation element 3, is preferably more than or equal to the temperature 50° C., more preferably 10° C., lower than the Curie point of the dielectric included in the power generation element 3. Such a dielectric is defined as the dielectric with the same specification as the dielectric included in the power generation element.

From the viewpoint of the power generation efficiency, the Curie point of the temperature detection element 35 and the Curie point of the power generation element 3 are preferably the same. It is more preferable that the temperature detection element 35 and the power generation element 3 are the same element.

Moreover, the relative dielectric constant of the power generation element 3 (dielectric (insulator)) is, for example, 1 or more, preferably 100 or more, and more preferably 2000 or more.

The second electrodes 36 are provided to detect the electromotive force from the temperature detection element 35 and the electric polarization of the temperature detection element 35.

The second electrode 36 is not particularly limited and may be any electrode that can detect the electromotive force from the temperature detection element 35 and the electric polarization of the temperature detection element 35. The second electrodes 36 include two electrodes (such as copper electrodes or silver electrodes) disposed opposite to each other with the temperature detection element 35 interposed therebetween, and a conductive wire connected to the electrodes. The second electrodes 36 are electrically connected to the temperature detection element 35.

The voltage application device 9 is provided for the power generation element 3 (power generation device 6) directly or closely in order to apply voltage to the power generation element 3 (power generation device 6). Specifically, the voltage application device 9 includes, for example, two voltage application electrodes 37 (such as copper electrodes or silver electrodes), a voltage application power source V, and a conductive wire connected thereto. The two voltage application electrodes 37 are disposed opposite to each other with the power generation element 3 and the first electrodes 4 interposed therebetween, in addition to the first electrodes 4. The voltage application device 9 is disposed to have the power generation element 3 and the first electrodes 4 interposed between the voltage application electrodes 37.

The control device 10 is a unit that executes the electric control over the power generation system 1 (such as ECU: Electronic Control Unit). The control device 10 includes a microcomputer including a CPU, a ROM, a RAM, and the like.

The control device 10 is electrically connected to the temperature detection device 7 and the voltage application device 9. The control device 10 activates or deactivates the voltage application device 9 upon the detection of the temperature increase or decrease of the exhaust gas by the temperature detection device 7 as described specifically below.

The energy collection system 29 further includes a booster 30, an AC/DC converter 31 (AC-DC converter), and a battery 32.

The booster 30, the AC/DC converter 31, and the battery 32 are electrically connected to the first electrodes 4.

Of the power system 2 and the energy collection system 29, the engine 11, the exhaust pipe 17, the power generation device 6 including the power generation element 3 and the first electrode 4, the exhaust pipe 17, the temperature detection device 7 including the temperature detection element 35 and the second electrodes 36, the voltage application device 9, and the control device 10 constitute the power generation system 1.

2. Power Generation Method

Description is hereinafter made of a power generation method with the use of the power generation system 1 described above.

In this power generation system 1, driving the engine 11 causes the piston of the cylinder 12 go up and down repeatedly. Thus, in the four-cycle type, for example, the intake step, the compression step, the explosion step, the exhaust step, and the like are sequentially carried out.

More specifically, in this engine 11, the throttle valve 27 is opened to supply air through the intake pipe 16 and at the same time supply (inject) a predetermined amount of fuel from the fuel supply pipe 22 through the fuel injection valve 23, and the air and the fuel are mixed. Then, the intake valve 18 is opened to supply the mixture of the air and fuel to the combustion chamber 14 of the cylinder 12 (intake step).

Next, the intake valve 18 is closed to make the piston 13 go up, whereby the mixture in the combustion chamber 14 is compressed to have higher temperature (compression step).

Next, the mixture is ignited with an ignition plug, which is not shown, and combusted explosively and at the same time, the piston 13 is pressed down by the explosion (explosion step).

After that, the exhaust valve 19 is opened so that the gas produced from the combustion (exhaust gas) is discharged from the cylinder 12 (exhaust step).

In this manner, the fuel is combusted in the engine 11 and the power is output. In addition, the exhaust gas with high temperature is discharged to the exhaust pipe 17.

The exhaust gas generated in the cylinders 12 flows in the exhaust pipes 17 connected to the cylinders 12 and is collected into one at a predetermined position. After that, the exhaust gas flows through the catalyst placement portion 24 and is cleaned by the catalyst. Then, the exhaust gas is brought into contact with the temperature detection device 7 and is released into the external air through the box-shaped container 5.

The temperature of the engine 11 and the exhaust gas discharged from the engine 11 is increased or decreased over time based on the operation state of the automobile 8 (driving state of the engine 11).

Specifically, the engine 11 of the automobile 8 is driven or stopped repeatedly over time. This controls the automobile 8 to run or stop.

In this case, while the engine 11 is driven, the temperature of the engine 11 is high. While the engine 11 is stopped, the temperature of the engine 11 is low.

The temperature of the engine 11 also changes over time depending on, for example, the load (weight of automobile, inclination of road, etc.), the speed, the opening degree of the accelerator, the engine speed of the engine 11, the intake pressure and intake air amount of the intake system, the fuel flow rate, and air-fuel ratio (intake air amount/fuel flow rate) while the automobile 8 runs.

The heat of the engine 11 transmits through the exhaust gas. This causes the temperature of the exhaust gas (temperature inside the exhaust pipe 17 and the box-shaped container 5) to increase or decrease over time in accordance with the state of the engine 11.

In the power generation system 1 as above, the temperature of the engine 11 and the exhaust gas in the high-temperature state is, for example, 200 to 1200° C., preferably 700 to 900° C. The temperature in the low-temperature state is less than the temperature in the high-temperature state, more specifically 100 to 800° C., preferably 200 to 500° C. The difference between the high-temperature state and the low-temperature state is, for example, 10 to 600° C., preferably 20 to 500° C.

In the power generation system 1, as described above, the box-shaped container 5 is disposed in the exhaust pipe 17 and the temperature detection device 7 is disposed on the upstream side relative to the box-shaped container 5. The temperature detection device 7 includes the temperature detection element 35 and the second electrodes 36. The second electrodes 36 are electrically connected to the control device 10.

In the box-shaped container 5, a plurality of power generation devices 6 including the power generation element 3 and the first electrodes 4, and the voltage application electrodes 37 are arranged. The voltage application electrodes 37 (voltage application device 9) are electrically connected to the control device 10.

Therefore, the exhaust gas discharged from the engine 11 is first brought into contact with the temperature detection element 35.

This contact causes the thermal energy of the engine 11 transmit to the temperature detection element 35 through the exhaust gas; thus, the temperature detection element 35 is heated and/or cooled. That is to say, the temperature detection element 35 is heated and/or cooled by the temperature change of the engine 11 and the exhaust gas that transmits the heat of the engine 11 over time.

For this reason, the temperature detection element 35 can be set to the high-temperature state or the low-temperature state over time. The temperature detection element 35 can be electrically polarized by the effect (for example, piezo effect or pyroelectric effect) in accordance with the element (for example, piezo element or pyroelectric element). The electromotive force from the temperature detection element 35 can be detected through the second electrodes 36 as the waveform that varies over time (for example, alternating current or pulsating current).

After that, the electromotive force detected from the temperature detection element 35 is transmitted as the electric signals to the control device 10 and whether the temperature detection element 35 is in the temperature-increasing state or the temperature-decreasing state is detected. That is to say, by detecting the state of the temperature detection element 35, whether the exhaust gas and the power generation element 3 are in the temperature-increasing state or the temperature-decreasing state is determined. More specifically, if the electromotive force detected from the temperature detection element 35 has a variation by a predetermined value (for example, +1 mV/s) or more, it is detected that the temperature detection element 35 is in the temperature-increasing state and it is determined that the exhaust gas and the power generation element 3 are also in the temperature-increasing state. In addition, if the electromotive force detected from the temperature detection element 35 has a variation by a predetermined value (for example, −1 mV/s) or more, it is detected that the temperature detection element 35 is in the temperature-decreasing state and it is determined that the exhaust gas and the power generation element 3 are also in the temperature-decreasing state.

In this power generation system 1, upon the detection of the temperature-increasing state of the temperature detection element 35, the control device 10 activates the voltage application device 9 to apply a predetermined voltage (for example, 50 to 1000 V) to the power generation element 3 (power generation device 6).

The voltage is applied for a period of time until the temperature detection element 35 becomes the temperature-decreasing state, specifically during the temperature-increasing state.

Upon the detection of the temperature-decreasing state of the temperature detection element 35, the control device 10 deactivates the voltage application device 9 to stop the voltage application to the power generation element 3 (power generation device 6).

The voltage application is stopped for a period of time until the temperature detection element 35 becomes the temperature-increasing state, specifically during the temperature-decreasing state.

The time after the voltage application device 9 is activated and before the voltage is applied (i.e., time until the electric field intensity reaches the predetermined value) and the time after the voltage application device 9 is deactivated and before the electric field intensity reaches 0 kV/mm can be regarded as 0 seconds substantially.

That is to say, in this power generation system 1, the time for which the voltage less than the predetermined value is applied is substantially 0 seconds. The state in which the voltage with the predetermined value is applied (ON) and the state in which the voltage is not applied (OFF) are switched by the control device 10.

As described above, in the power generation system 1, upon the detection of the temperature increase of the temperature detection element 35, the voltage application device 9 is activated to apply voltage to the power generation element 3 (power generation device 6). On the other hand, upon the detection of the temperature decrease of the temperature detection element 35, the voltage application device 9 is deactivated to stop the voltage application.

The exhaust gas in contact with the temperature detection element 35 is then brought into contact with the power generation element 3.

This causes the thermal energy of the engine 11 to transmit to the power generation element 3 through the exhaust gas, so that the power generation element 3 is heated and/or cooled. That is to say, the power generation element 3 is heated and/or cooled as the temperature of the engine 11 and the exhaust gas that transmits the heat of the engine 11 changes over time.

This enables the power generation element 3 to be in the high-temperature state or the low-temperature state over time. The power generation element 3 can be electrically polarized by the effect (for example, piezo effect or pyroelectric effect) in accordance with the element (for example, piezo element or pyroelectric effect).

In this power generation system 1, the electric power can be extracted from the power generation element 3 as the waveform that varies over time (such as alternating current or pulsating current) through the first electrodes 4.

In the power generation system 1 as above, the voltage is applied from the voltage application device 9. This causes the power generation element 3 to generate more power, enabling the more efficient power generation.

In this method, the electric power obtained as above is boosted by the booster 30 connected to the first electrodes 4 as necessary, which is shown by a dotted line in FIG. 1. In addition, this electric power is converted into DC voltage in the AC/DC converter 31 and then stored in the battery 32. The electric power stored in the battery 32 can be used as the power for the automobile 8 or various electric components mounted on the automobile 8.

The power generation system 1 employs the temperature detection element 35 including the dielectric with the same specification as the dielectric included in the power generation element 3. Thus, the responsiveness of the power generation element 3 and the temperature detection element 35 relative to the temperature change can be made the same as or close to each other.

Therefore, the voltage can be applied to the power generation element 3 with high responsiveness in accordance with the temperature change of the power generation element 3.

Thus, the energy can be extracted efficiently from the power generation element 3 and the power generation efficiency can be improved.

In some examples, a temperature sensor including a thermocouple is used to detect the temperature of the power generation element 3, and in other examples, a temperature prediction system technique is used to predict the temperature of the power generation element 3 in view of the status of the driving of the engine 11, etc. As compared to these examples, this power generation system 1 employs the temperature detection element 35, which is the same type of element as the power generation element 3 (dielectric with the Curie point), so that the responsiveness to the temperature change is improved further and this responsiveness can be made the same as or close to the responsiveness of the power generation element 3 to the temperature change.

In the power generation system 1, the temperature of the power generation element 3 and the temperature detection element 35 is not increased or decreased depending on the method of heating and/or cooling, and maintained temporarily to the constant temperature state (temperature change does not occur substantially and the electromotive force detected from the temperature detection element 35 is less than a predetermined value (for example, 1 mV/s). In this case, the voltage is applied while the temperature of the temperature detection element 35 is increased or while the temperature is maintained constant after the temperature increase. The voltage application is stopped while the temperature is decreased or the temperature is maintained constant after the temperature decrease. If the power system 2 of the automobile 8 is employed as the heat source, the temperature of the power generation element 3 and the temperature detection element 35 is increased or decreased repeatedly without being maintained constant substantially.

In the above description, the power system 2 is used as the heat source. However, the heat source is not limited to the above and may be, for example, other energy using devices such as an internal-combustion engine or a light-emitting device. In these cases, the heat medium may be, for example, light, air, or the like.

Preferably, the heat source is the internal-combustion engine or the power system 2 and the heat medium is the exhaust gas. More preferably, the heat source is the power system 2.

In the above description, the temperature detection device 7 is disposed in the box-shaped container 5 at a distance of 20 cm or less from the upstream end of the power generation device 6. The control device 10 can advance or delay the timing of the voltage application of the voltage application device 9 in consideration of the timing where the exhaust gas that has increased the temperature of the temperature detection element 35 passes through the power generation element 3.

In the above description, the control device 10 and the engine control unit 28 are separate devices but these devices may be formed as one control unit (such as ECU).

In the above description, moreover, the first electrodes 4 and the voltage application electrodes 37 are separate electrodes but may be formed as one electrode.

Figure 3:
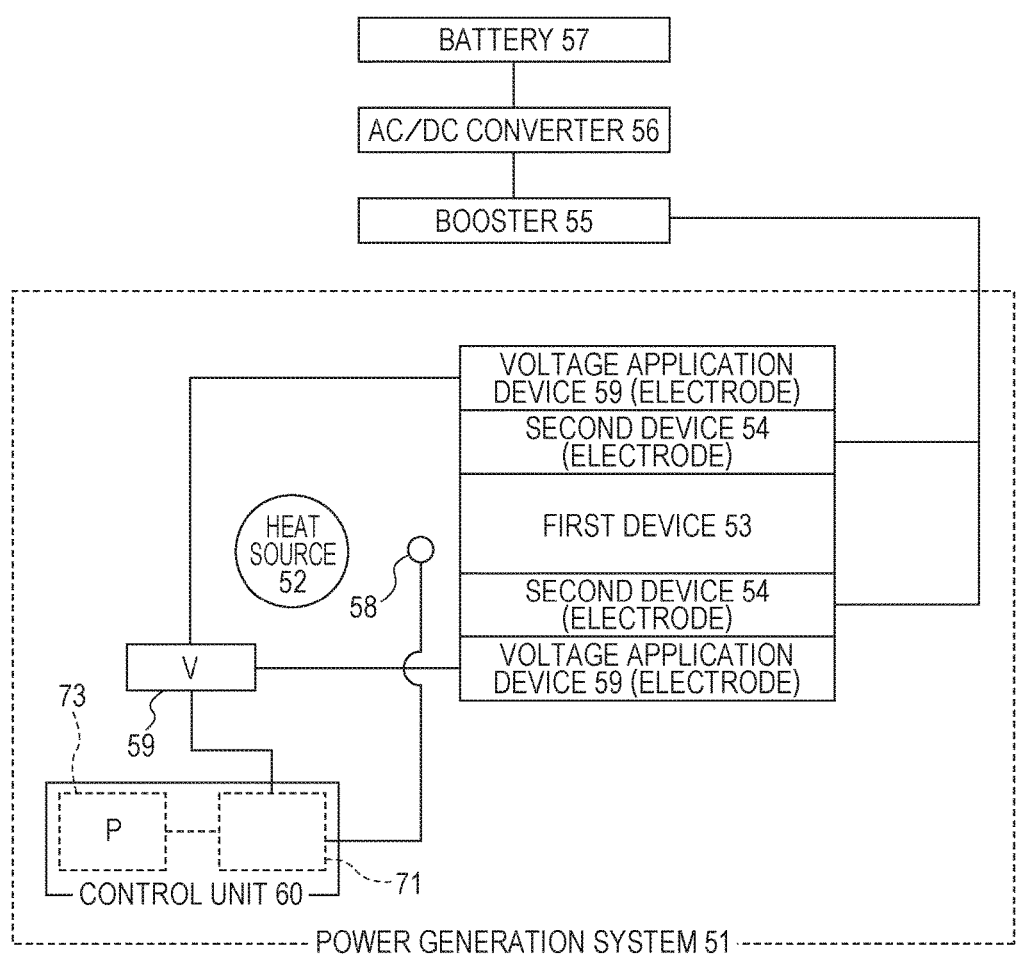
FIG. 3 is a schematic structure view illustrating another embodiment of the power generation system according to the present invention.

FIG. 3 is a schematic structure view illustrating another embodiment of the power generation system according to the present invention.

In FIG. 3, a power generation system 51 includes a heat source 52 of which temperature is increased or decreased over time, a first device 53, second devices 54, voltage application devices 59 as a voltage application unit, and a control unit 60. The first device 53 is electrically polarized when the temperature thereof is increased or decreased over time depending on the temperature change of the heat source 52. The second devices 54 extract electric power from the first device 53. The voltage application devices 59 apply voltage to the first device 53. The control unit 60 activates or deactivates the voltage application devices 59.

The heat source 52 is not particularly limited and may be any heat source of which temperature is increased or decreased over time, specifically a heat source of which temperature is increased or decreased over time periodically. Examples of the heat source 52 include various kinds of energy using devices such as the internal-combustion engine and the light-emitting device.

The internal-combustion engine is, for example, a device that outputs the power for the vehicles and the like. The internal-combustion engine may be, for example, a single cylinder type or a multi-cylinder type. Each cylinder may be a multi-cycle type (for example, two-cycle type, four-cycle type, or six-cycle type).

In such an internal-combustion engine, the piston repeatedly goes up and down in each cylinder. Thus, in the four-cycle type, for example, the intake step, the compression step, the explosion step, the exhaust step, and the like are sequentially carried out, so that the fuel is combusted and the power is output.

In such an internal-combustion engine, the high-temperature exhaust gas is discharged through the exhaust gas pipe in the exhaust step. The thermal energy is transmitted using the exhaust gas as the heat medium and the temperature in the exhaust gas pipe is increased.

On the other hand, in the other steps (steps other than the exhaust step), the amount of exhaust gas in the exhaust gas pipe is reduced. Therefore, the temperature inside the exhaust gas pipe is lower than in the exhaust step.

In this manner, the temperature of the internal-combustion engine is increased in the exhaust step and decreased in the intake step, the compression step, and the explosion step. That is to say, the temperature of the internal-combustion engine is increased or decreased over time.

The aforementioned steps are sequentially repeated periodically in accordance with the piston cycle. Thus, in the exhaust gas pipe of each cylinder in the internal-combustion engine, the temperature changes occurs periodically, more specifically, the high-temperature state and the low-temperature state are repeated periodically in accordance with the cycle of repeating the steps.

While the light-emitting device is on (lighted), the temperature thereof is increased by the thermal energy using the light such as infrared ray or visible light as the heat medium and while the light is off, the temperature thereof is decreased. Therefore, the temperature of the light-emitting device is increased or decreased over time by turning on (lighting) or off the light-emitting device over time.

In particular, if the light-emitting device is the device of which illumination is turned on or off repeatedly and intermittently over time (blinking (flashing) type), the temperature of the light-emitting device is changed periodically by the thermal energy of the light in the lighting (light emission). More specifically, the high-temperature state and the low-temperature state are repeated periodically.

The heat source 52 may, for example, include a plurality of heat sources and by switching between the heat sources, the temperature change can be caused.

More specifically, for example, the following mode is given. In this mode, two heat sources are prepared: a low-temperature heat source (such as a cooling material) and a high-temperature heat source (such as a heating material) with a higher temperature than the low-temperature heat source. The low-temperature heat source and the high-temperature heat source are used alternately over time.

This can increase or decrease the temperature of the heat source over time. In particular, the temperature can be changed periodically by periodically repeating to switch between the low-temperature heat source and the high-temperature heat source.

The heat source 52 including a plurality of switchable heat sources is not particularly limited and may be, for example, a low-temperature air supply system for combustion, a heat storage type heat exchanger, a high-temperature gas exhaustion system, a high-temperature air combustion furnace with a supply/exhaust switch valve (for example, high-temperature gas generator disclosed in Re-publication of PCT International Publication No. 96-5474), or a sea water exchanging device including a high-temperature heat source, a low-temperature heat source, and hydrogen absorbing alloy (hydrogen absorbing alloy actuator type sea water exchanging device).

Any of the heat sources may be used alone or two or more kinds thereof may be used in combination as the heat source 52.

The heat source 52 is preferably an internal-combustion engine.

The first device 53 is a device that is electrically polarized in accordance with the temperature change of the heat source 52.

Here, the electric polarization refers to the phenomenon that the dielectric polarization occurs due to the displacement of positive and negative ions caused by the crystal strain to produce the potential difference, for example, the piezo effect and/or the phenomenon that the dielectric constant changes due to the temperature change to produce the potential difference, for example the phenomenon that the electromotive force is caused in the material, such as the pyroelectric effect.

The first device 53 may be, for example, a device that is electrically polarized by the piezo effect and a device that is electrically polarized by the pyroelectric effect.

The piezo effect is the effect (phenomenon) that the electric polarization occurs depending on the amount of the applied stress or strain.

The first device 53 that is electrically polarized by the piezo effect is not particularly limited and may be a known piezo element (piezoelectric element).

In the case of using the piezo element as the first device 53, the piezo element is disposed with its periphery fixed by a fixing member to be in contact with the heat source 52 or in contact with (or exposed to) a heat medium (the aforementioned exhaust gas or light, for example) that transmits the heat of the heat source 52.

The fixing member is not particularly limited and may be, for example, the second device 54 (such as an electrode) as described below.

In such a case, the piezo element is heated or cooled (through a heat medium (the aforementioned exhaust gas or light, for example) depending on the case) as the temperature of the heat source 52 changes over time. This causes the piezo element to expand or contract.

On this occasion, the volume expansion of the piezo element is suppressed by the fixing member. For this reason, the piezo element is pressed by the fixing member and electrically polarized by the piezo effect (piezoelectric effect) or the phase transformation around the Curie point. Thus, the electric power is extracted from the piezo element through the second device 54 as described below.

The electric polarization of the piezo element is neutralized usually when the heated state or cooled state is maintained so that the temperature is made constant (i.e., volume is made constant). The piezo element is electrically polarized again if cooled or heated afterward.

Therefore, if the temperature of the heat source 2 is periodically changed and the high-temperature state and the low-temperature state are repeated periodically, for example, the piezo element is repeatedly heated or cooled periodically. For this reason, the electric polarization and the neutralization of the piezo element are repeated periodically.

This causes the second device 54 to extract the electric power as the waveform that varies periodically (for example, alternating current or pulsating current).

The pyroelectric effect refers to the effect (phenomenon) that the insulator (dielectric) or the like is electrically polarized in accordance with the temperature change when the insulator is heated or cooled, and includes the first effect and the second effect.

The first effect refers to the effect that the spontaneous polarization occurs depending on the temperature change when the insulator is heated or cooled and charges are produced on the surface of the insulator.

The second effect refers to the effect (piezo effect or piezoelectric effect) that when the insulator is heated or cooled, the crystal structure is pressure-deformed depending on the temperature change, and the piezoelectric polarization occurs due to the stress or strain applied to the crystal structure.

The device that is electrically polarized by the pyroelectric effect is not particularly limited and may be a known pyroelectric element.

If the pyroelectric element is used as the first device 53, the pyroelectric element is disposed in contact with the heat source 52 or in contact with (exposed to) the heat medium that transmits heat of the heat source 52 (such as the aforementioned exhaust gas or light).

In this case, the pyroelectric element is heated or cooled as the temperature of the heat source 52 changes over time (in some cases, through the heat medium (the aforementioned exhaust gas or light)) to be electrically polarized by the pyroelectric effect (including the first effect and the second effect). This extracts the electric power from the pyroelectric element through the second devices 54 as described specifically below.

In such a pyroelectric element, when the heated state or the cooled state is maintained so that the temperature becomes constant, the electrical polarization is usually neutralized. The pyroelectric element is electrically polarized again if cooled or heated afterward.

Therefore, if the heat source 52 changes in temperature periodically and the high-temperature state and the low-temperature state are repeated periodically, the pyroelectric element is repeatedly heated or cooled periodically. Thus, the electrical polarization and the neutralization of the pyroelectric element are repeated periodically.

As a result, the electric power is extracted by the second devices 54 as the waveform that varies periodically (such as alternating current or pulsating current).

These first devices 53 can be used alone or two or more kinds may be used in combination.

Specific examples of the first device 53 include, as described above, known pyroelectric elements (such as $BaTiO_3$, $CaTiO_3$, $(CaBi)TiO_3$, $BaNd_2Ti_5O_{14}$, $BaSm_2Ti_4O_{12}$, and lead zirconate titanate (PZT:$Pb(Zr,Ti)O_3$)), known piezo elements (for example, crystal ($SiO_2$), zinc oxide (ZnO), Rochelle salt (potassium tartrate-sodium) ($KNaC_4H_4O_6$), lead zirconate titanate (PZT:$Pb(Zr,Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride (AlN), tourmaline (turmaline), polyvinylidene fluoride (PVDF)), $Ca_3(VO_4)_2$, $Ca_3(VO_4)_2$/Ni, $LiNbO_3$, $LiNbO_3$/Ni, $LiTaO_3$, $LiTaO_3$Ni, $Li(Nb_{0.4}Ta_{0.6})_3$, $Li(Nb_{0.4}Ta_{0.6})O_3$/Ni, $Ca_3\{(Nb,Ta)O_4\}_2$, $Ca_3\{(Nb, Ta)O_4\}_2$/Ni and the like.

In addition, the first device 53 may be a dielectric such as $LaNbO_3$, $LiNbO_3$, $KNbO_3$, $MgNbO_3$, $CaNbO_3$, $(K_{1/2}Na_{1/2})NbO_3$, $(Bi_{1/2}K_{1/4}Na_{1/4})NbO_3$, $(Sr_{1/100}(K_{1/2}Na_{1/2})_{99/100})NbO_3$, $(Ba_{1/100}(K_{1/2}Na_{1/2})_{99/100})NbO_3$, or $(Li_{1/10}(K_{1/2}Na_{1/2})_{9/10})NbO_3$.

The Curie point of the first device 53 is, for example, −77° C. or more, preferably −10° C. or more and 1300° C. or less, preferably 900° C. or less.

The relative dielectric constant of the first device 53 (insulator (dielectric)) is, for example, 1 or more, preferably 100 or more, and more preferably 2000 or more.

The power generation system 51 as described above enables the extraction of electric power with higher voltage and higher energy conversion efficiency as the first device 53 (insulator (dielectric)) has a higher relative dielectric constant. On the other hand, if the relative dielectric constant of the first device 53 is less than the lower limit, the energy conversion efficiency may be low and the electric power to be obtained may have low voltage.

Note that the first device 53 (insulator (dielectric)) is electrically polarized depending on the temperature change of the heat source 52. The electric polarization may be any of electronic polarization, ionic polarization, and orientation polarization.

For example, in the case of using the material that is polarized by the orientation (for example, liquid crystal material), it is expected that the power generation efficiency is improved by changing the molecular structure of that material.

In FIG. 3, the second devices 54 are provided to extract electric power from the first device 53.

More specifically, the second devices 54 are not limited in particular and may include, for example, two electrodes (for example, copper electrodes or silver electrodes) disposed opposite to each other with the first device 53 interposed therebetween, and a conductive wire connected to these electrodes. The second devices 54 are electrically connected to the first device 53.

The voltage application devices 59 are provided directly or closely for the first device 53 to apply voltage to the first device 53. Specifically, the voltage application devices 59 include two electrodes (for example, copper electrodes or silver electrodes), a voltage application power source V, and a conductive wire connected to these electrodes. The two electrodes are disposed opposite to each other with the first device 53 interposed therebetween separate from the second devices 54. The voltage application devices 59 are disposed to have the first device 53 and the second devices 54 interposed between the electrodes.

The control unit 60 is a unit that executes the electric control over the power generation system 51 (for example, ECU: Electronic Control Unit). The control unit 60 is formed by a microcomputer including a memory 73 and a central processing unit (CPU) 71.

The memory 73 includes a ROM and a RAM. The ROM stores various programs and fixed data. The RAM stores temporal input data.

The ROM of the memory 73 stores a temperature prediction program P as a prediction unit that predicts the temperature of the first device 53.

The temperature prediction program P is a program for predicting the cycle of the temperature change and the temperature of the first device 53 on the basis of the operation state of the heat source 52 and the transition (history) of the temperature of the first device 53. The temperature prediction program P is formed based on the data measured in advance.

The central processing unit (CPU) 71 is connected electrically to, for example, various detection devices which are not shown, such as the output meter of the heat source 52 and the thermometer (such as thermocouple) that measures the temperature of the first device 53. Various pieces of data can be input to the central processing unit (CPU) 71. This enables the RAM of the memory 73 to receive and store the temporal numerals used for processing the temperature prediction program P, including the operation state of the heat source 52 and the transition (history) of the temperature of the first device 53.

The central processing unit (CPU) 71 is a control unit that predicts and calculates the temperature on the basis of the temperature prediction program P of the memory 73 and activates or deactivates the voltage application device 59 on the basis of the predicted temperature. The central processing unit (CPU) 71 is electrically connected to the memory 73 as illustrated by a dashed line and moreover electrically connected to the voltage application device 59.

The central processing unit (CPU) 71 can predict the temperature of the first device 53 following the temperature prediction program P on the basis of the information detected by the detection device (such as the output meter of the heat source 52 and the thermometer of the first device 53) as described below.

The central processing unit (CPU) 71 can activate or deactivate the voltage application device 59 on the basis of the temperature state of the first device 53 predicted from the temperature prediction program P.

In the power generation system 51 illustrated in FIG. 3, the second devices 54 are electrically connected to a booster 55, an AC/DC converter (AC-DC converter) 56 and a battery 57 sequentially.

For the power generation with the power generation system 51, first, the temperature of the heat source 52 is increased or decreased over time, specifically periodically. With the heat source 52, the first device 53 is heated and/or cooled.

In accordance with this temperature change, the first device 53 is electrically polarized periodically. After that, through the second device 54, the electric power is extracted as the waveform that varies periodically (such as alternating current or pulsating current) in accordance with the periodic electric polarization of the first device 53.

In such a power generation system 51, the temperature of the heat source 52 is 200 to 1200° C., preferably 700 to 900° C. in the high-temperature state. The temperature in the low-temperature state is less than the temperature in the high-temperature state, more specifically 100 to 800° C., preferably 200 to 500° C. The temperature difference between the high-temperature state and the low-temperature state is 10 to 600° C., preferably 20 to 500° C.

The high-temperature state and the low-temperature state are repeated at a cycle of, for example, 10 to 400 cycles/s, preferably 30 to 100 cycles/s.

For more efficient power generation in this power generation system 51, the voltage is applied to the first device 53 in accordance with the temperature state of the first device 53.

In this power generation system 51, the heating and/or cooling is carried out by the heat source 52. With the temperature prediction program P, the temperature of the first device 53 is predicted. Based on the temperature of the first device 53 that is predicted by the temperature prediction program P, the central processing unit (CPU) 71 controls to activate or deactivate the voltage application device 59.

Figure 4:
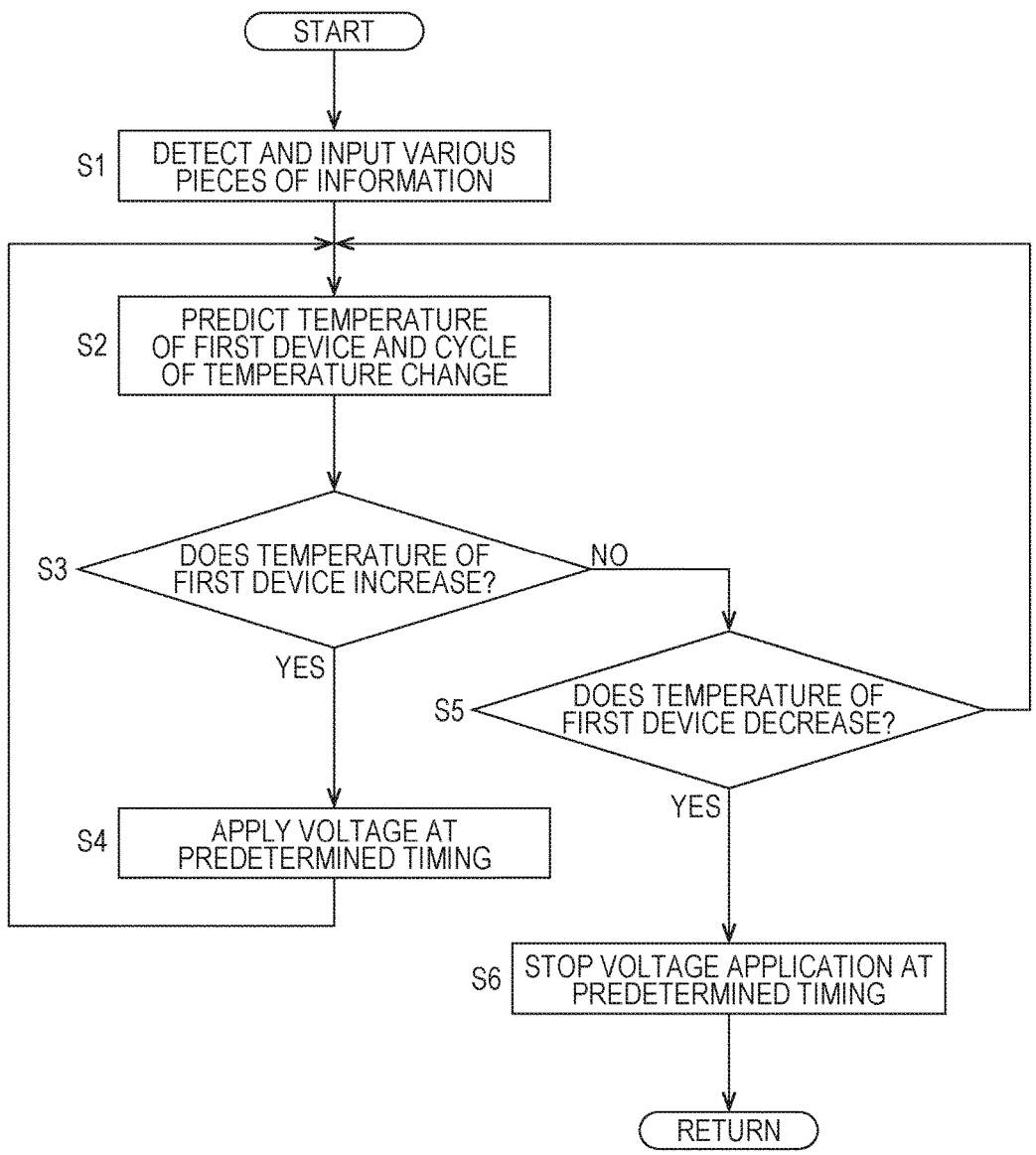
FIG. 4 is a flowchart illustrating a control process to be executed by a control unit illustrated in FIG. 3.

FIG. 4 is a flowchart illustrating a control process to be executed by the control unit 60 illustrated in FIG. 3. The control process (temperature prediction program P) illustrated in FIG. 4 is stored in the ROM of the memory 73. The control process is executed by the central processing unit (CPU) 71.

This control process is triggered by the start of the operation of the heat source 52.

Upon the start of the process, for example, various pieces of information including the operation state of the heat source 52 and the transition (history) of the temperature of the first device 53 are detected continuously by the detection device that is not shown, and input to the memory 73 as the electric signals (S1).

Next, in this process, the subsequent temperature change of the first device 53 is predicted by the temperature prediction program P on the basis of the operation state of the heat source 52 and the previous transition (history) of the temperature of the first device 53 that are detected and input as above. Thus, the cycle of the temperature change of the first device 53 (time required to heat and cool in one cycle) is predicted (S2).

Note that the calculation method of predicting the temperature change and the cycle of the first device 53 is not limited in particular and may be a known method.

The cycle of the temperature change of the first device 53 (time required to heat and cool in one cycle) is, for example, 0.01 seconds or more, preferably 0.02 seconds or more, and for example 40 seconds or less, preferably 20 seconds or less.

In this power generation system 51, whether the temperature of the first device 53 increases or not is predicted by the temperature prediction program P (S3). In this power generation system 51, if the temperature of the first device 53 has increased at a predetermined value (for example, 0.2° C./s) or more, it is determined that the device is in the temperature-increasing state.

If it is predicted that the temperature of the first device 53 increases (YES in S3), the time at which the temperature starts to increase is predicted by the temperature prediction program P.

At a timing of −15% or more and less than 0% of the cycle of the temperature change of the first device 53 from the predicted start time of the temperature increase, the central processing unit (CPU) 21 activates the voltage application device 59 and a predetermined voltage is applied to the first device 53 (S4).

In this method, the voltage application device 59 is activated at a timing earlier by a predetermined period than the predicted start time of the temperature increase of the first device 53 (−15% or more and less than 0% of the period of one temperature change cycle).

In regard to the applied voltage, the electric field intensity is, for example, 0.2 kV/mm or more, preferably 0.4 kV/mm or more, and 5 kV/mm or less, preferably 4 kV/mm or less.

When the applied voltage (electric field) is in the above range, the amount of energy extracted from the first device 53 and the amount of energy consumed by the voltage application device 59 are well balanced. Thus, the power generation with the excellent efficiency is possible.

On the other hand, if the temperature increase of the first device 53 is not predicted (NO in S3), whether the temperature of the first device 53 decreases or not is predicted in accordance with the temperature prediction program P (S5). In this power generation system 51, for example, if the temperature of the first device 53 has decreased at a predetermined value (for example, 0.2° C./s) or more, it is determined that the device is in the temperature-decreasing state.

If it is predicted that the temperature of the first device 53 decreases (YES in S5), the time at which the temperature starts to decrease is predicted in accordance with the temperature prediction program P.

At a timing of −15% or more and less than 0% of the cycle of the temperature change of the first device 53 from the predicted start time of the temperature decrease, the central processing unit (CPU) 71 deactivates the voltage application device 9 and the voltage application to the first device 53 is stopped (S6).

In this method, the voltage application device 59 is deactivated at a timing earlier by a predetermined period than the predicted start time of the temperature decrease of the first device 53 (−15% or more and less than 0% of the period of one temperature change cycle).

If the temperature decrease of the first device 53 is not predicted (NO in S5), i.e., if it is predicted that the temperature of the first device 53 neither increases nor decreases and remains constant, the temperature change of the first device 53 is continuously predicted until the temperature increase or decrease of the first device 53 is predicted (S2).

For example, if the internal-combustion engine is used as the heat source 52, the first device 53 is heated and/or cooled by the internal-combustion engine in the power generation system 51. Therefore, the first device 53 does not maintain the constant-temperature state substantially and the temperature-increasing state and the temperature-decreasing state are repeated.

The time after the voltage application device 59 is activated and before the voltage is applied (i.e., the intensity of the electric field reaches the predetermined value) and the time after the voltage application device 59 is deactivated and before the intensity of the electric field reaches 0 kV/mm are regarded as 0 seconds substantially. In other words, in this power generation system 51, the time for which the voltage less than the predetermined value is applied is substantially 0 seconds. The state in which the voltage with the predetermined value is applied (ON) and the state in which the voltage is not applied (OFF) are switched by the central processing unit (CPU) 71.

In the power generation system 51, the electric power can be extracted efficiently from the first device 53 by repeating the above process, and the power generation efficiency can be thusly improved.

In the power generation system 51, the voltage application device 59 is activated at a timing of −15% or more and less than 0% of the cycle of the temperature change of the first device 53 from the predicted start time of the temperature increase. The voltage application device 59 is deactivated at a timing of −15% or more and less than 0% of the cycle from the predicted start time of the temperature decrease.

That is to say, in the power generation system according to one embodiment of the present invention, the voltage application device 59 is activated at a timing earlier by a predetermined period than the predicted start time of the temperature increase (−15% or more and less than 0% of the one temperature change cycle). The voltage application device 59 is deactivated at a timing earlier by a predetermined period than the predicted start time of the temperature decrease (−15% or more and less than 0% of the one temperature change cycle).

By activating and deactivating the voltage application device 59 at this timing, the electric power can be extracted efficiently from the first device 53, and the power generation efficiency can be improved.

In one way to improve the power generation efficiency, the level of the applied voltage is changed in accordance with the temperature state of the first device 53 besides simply activating and deactivating the voltage application device 59 as described above. In this method, however, gradually increasing or decreasing the applied voltage is necessary, which is complicated and takes time and effort.

On the other hand, in the power generation system 51, the power generation efficiency can be improved by a relatively simple method of activating or deactivating the voltage application device 59.

In this power generation system 51, the extracted electric power is boosted in the form of the waveform that varies periodically (for example, alternating current or pulsating current) in the booster 55 connected to the second device 54. The booster 55 may be a booster with the simple structure including a coil, a capacitor, or the like to boost the AC voltage with high efficiency.

Next, the electric power boosted in the booster 55 is converted into DC voltage in the AC/DC converter 56 and stored in the battery 57.

The power generation system 51 employs the heat source 52 of which temperature is increased or decreased over time. Thus, the varying voltage (for example, AC voltage) can be extracted. As a result, as compared to the electric power with the constant voltage (DC voltage), the electric power can be boosted with high efficiency and stored with the simple structure.

If the heat source 52 is the heat source of which temperature changes periodically, the electric power can be extracted as the waveform that varies periodically. As a result, the power can be boosted with higher efficiency and stored with the simple structure.

Figure 5:
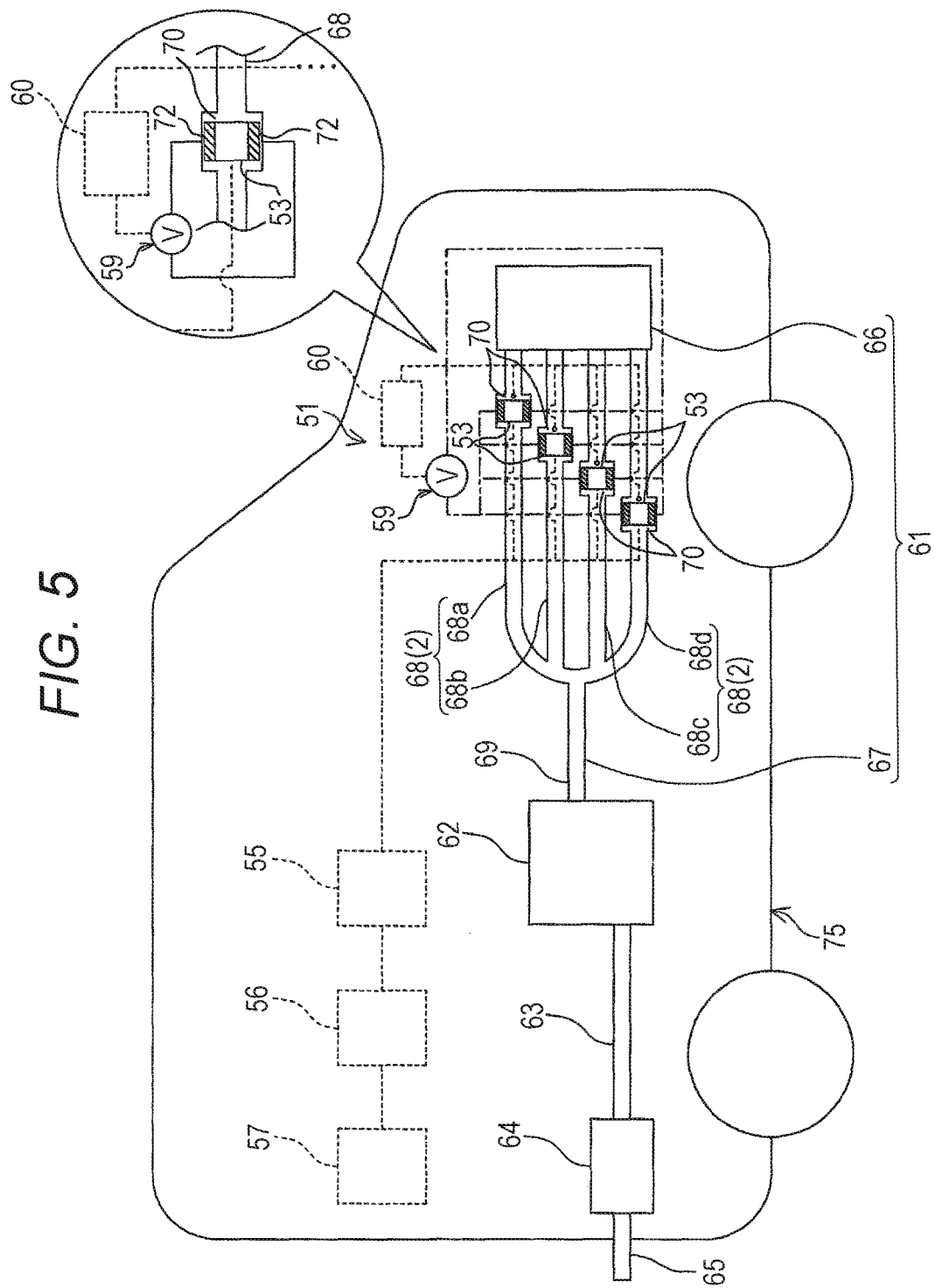
FIG. 5 is a schematic structure view illustrating an example in which a power generation system according to another embodiment of the present invention is mounted in an automobile.
Figure 6:
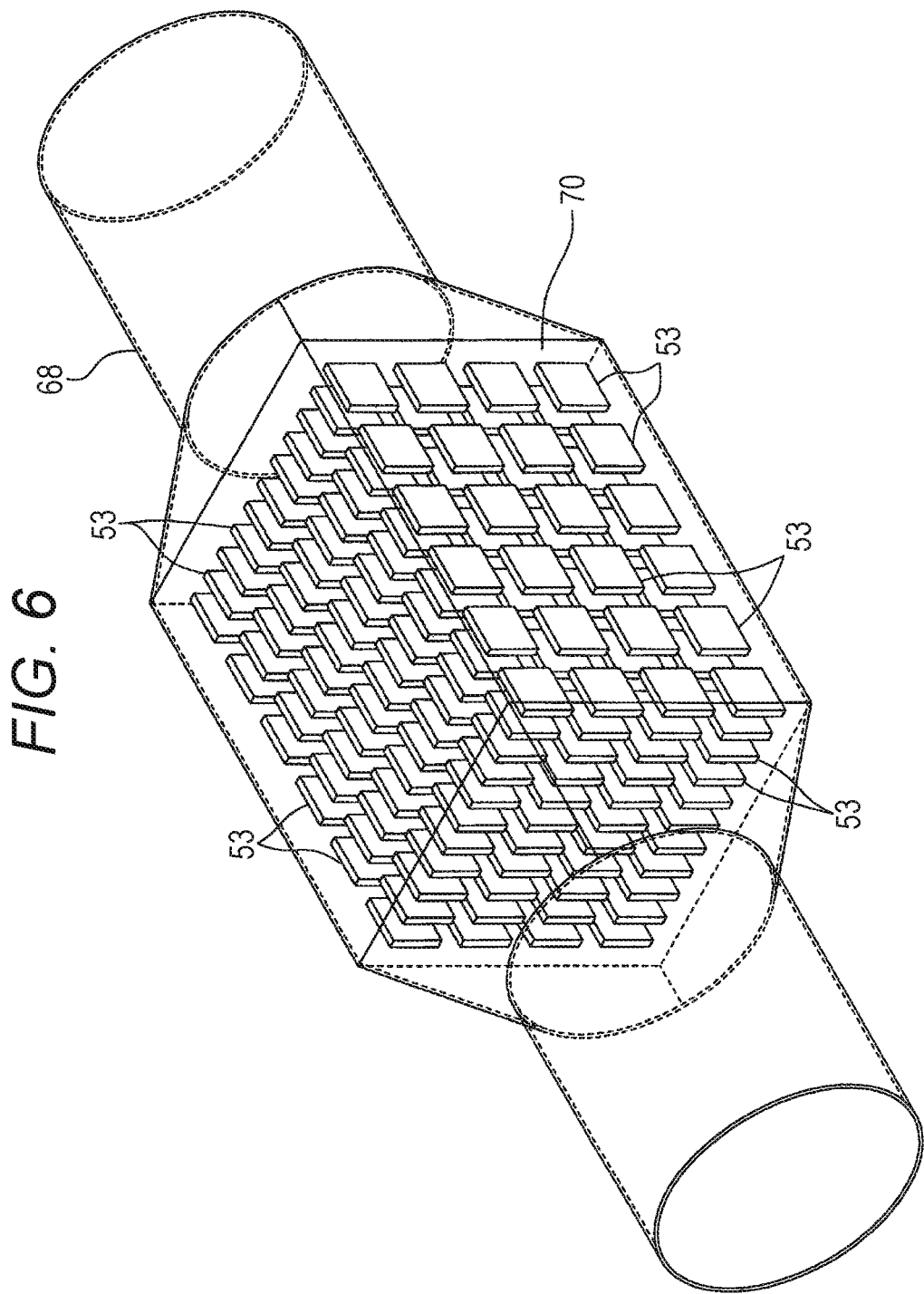
FIG. 6 is a magnified view illustrating a main part of the power generation system illustrated in FIG. 5.

FIG. 5 is a schematic structure diagram illustrating an example of an automobile in which a power generation system according to one embodiment of the present invention is mounted. FIG. 6 is a magnified view illustrating a main part of the power generation system illustrated in FIG. 5.

In FIG. 5, an automobile 75 includes an internal-combustion engine 61, a catalyst placement portion 62, an exhaust pipe 63, a muffler 64, and a discharge pipe 65.

The internal-combustion engine 61 includes an engine 66 and an exhaust manifold 67.

The engine 66 is a multi-cylinder (four-cylinder), multi-cycle (four-cycle) engine. Each cylinder is connected to an upstream end of a branch pipe 68 (described below) of the exhaust manifold 67.

The exhaust manifold 67 is an exhaust pipe with multiple branches provided for collecting the exhaust gas discharged from the cylinders of the engine 66. The exhaust manifold 67 includes a plurality of (four) branch pipes 68 and a collection pipe 69. The plurality (four) branch pipes 68 is connected to the cylinders of the engine 66 (if these pipes need to be distinguished, the pipes are referred to as a branch pipe 68a, a branch pipe 68b, a branch pipe 68c, and a branch pipe 68d in order from above in FIG. 5). The collection pipe 69 collects the branch pipes 68 into one on the downstream side of the branch pipes 68.

The branch pipes 68 each include one box-shaped space 70 in the middle in the flowing direction. The box-shaped space 70 is a space with an approximately rectangular parallelepiped shape and provided to communicate with the branch pipe 68. The box-shaped space 70 includes a plurality of first devices 53 and second devices 54 (not shown) (see FIG. 6).

In FIG. 6, the plurality of first devices 53 is simplified and one first device 53 is illustrated relative to one box-shaped space 70, and the second device 54 is omitted.

In the exhaust manifold 67, the upstream end of the branch pipe 68 is connected to the cylinder of the engine 66. Moreover, the downstream end of the branch pipe 68 and the upstream end of the collection pipe 69 are connected. The downstream end of the collection pipe 69 is connected to the upstream end of the catalyst placement portion 62.

The catalyst placement portion 62 includes, for example, a catalyst carrier and a catalyst to be applied onto the carrier. The catalyst placement portion 62 is connected to the downstream end of the internal-combustion engine 61 (exhaust manifold 67) in order to clean the harmful component included in the exhaust gas discharged from the internal-combustion engine 61, such as hydrogen carbide (HC), nitrogen oxide ($NO_X$), and carbon monoxide (CO).

The exhaust pipe 63 is provided to guide the exhaust gas cleaned in the catalyst placement portion 62 to the muffler 64. The exhaust pipe 63 has the upstream end connected to the catalyst placement portion 62 and the downstream end connected to the muffler 64.

The muffler 64 is provided to reduce the noise produced in the engine 66 (especially in the explosion step). The muffler 64 has the upstream end connected to the downstream end of the exhaust pipe 63. The muffler 64 has the downstream end connected to the upstream end of the discharge pipe 65.

The exhaust gas discharged from the engine 66 goes through the exhaust manifold 67, the catalyst placement portion 62, the exhaust pipe 63, and the muffler 64 sequentially, so that the exhaust gas is cleaned and has the reduced noise. The discharge pipe 65 is provided to release this exhaust gas to the outside. The discharge pipe 65 has the upstream end connected to the downstream end of the muffler 64 and the downstream end open to the external air.

This automobile 75 has the power generation system 51 mounted therein.

This power generation system 51 includes the heat source 52, the first device 53, the second device 54, the voltage application device 59, and the control unit 60 as described above.

This power generation system 51 employs the engine 66 of the internal-combustion engine 61 as the heat source 52. As illustrated in the magnified view and FIG. 6, the first device 53 is disposed in the box-shaped space 70 of each branch pipe 68.

The first device 53 has a sheet-like shape. The plurality of first devices 53 is arranged at intervals in the box-shaped space 70. In addition, the first device 53 is fixed by the second device 54, which is not shown (and by the fixing member (not shown) provided as necessary).

This enables the front and rear surfaces of the first device 53 and additionally the peripheral surface thereof to be exposed to the external air in the box-shaped space 70 through the second device 54, which is not shown, so as to be able to be in contact with (exposed to) the exhaust gas.

Although not shown, the second device 54 includes two electrodes disposed opposite to each other with the first device 53 interposed therebetween and the conductive wire connected to these electrodes.

The voltage application device 59 includes a plurality of (two relative to one first device 53) electrodes 72. The electrodes 72 are disposed opposite to each other outside the first device 53 having the first device 53 between the electrodes 72. These electrodes 72 are connected in parallel to each other through branched conductive wires or the like.

By applying voltage to the electrodes 72 from the voltage application power source V, the voltage can be applied between the electrodes 72, i.e., to the first device 53.

FIG. 5 illustrates schematically the first device 53 and the pair of electrodes 72 disposed opposite to each other with the first device 53 interposed therebetween in each box-shaped space 70.

The control unit 60 is electrically connected to the voltage application device 59 through the branched conductive wire or the like as illustrated by a dashed line outside the box-shaped space 70. Although not shown, the control unit 60 is connected in parallel to each of the temperature sensors (not shown) provided in each box-shaped space 70 through the branched conductive wire or the like.

The power generation system 51 is electrically connected to the booster 55, the AC/DC converter 56, and the battery 57 sequentially as illustrated in FIG. 5.

In the automobile 75, the driving of the engine 66 causes the piston to go up and down repeatedly and the intake step, the compression step, the explosion step, and the exhaust step are carried out sequentially and the temperature is increased and decreased over time.

More specifically, the pistons in two cylinders including the cylinder connected to the branch pipe 68a and the cylinder connected to the branch pipe 68c operate together and the intake step, the compression step, the explosion step, and the exhaust step are carried out in the same phase. This burns the fuel to output the power. In the exhaust step, the high-temperature exhaust gas goes through the branch pipe 68a and the branch pipe 68c.

On this occasion, the heat of the engine 66 is transmitted through the exhaust gas (heat medium). The internal temperature of the branch pipe 68a and the branch pipe 68c increases in the exhaust step and decreases in the other steps (the intake step, the compression step, the explosion step). The internal temperature increases or decreases over time in accordance with the piston cycle and the high-temperature state and the low-temperature state are repeated periodically.

At a timing different from the aforementioned two cylinders, the pistons in two cylinders including the cylinder connected to the branch pipe 68b and the cylinder connected to the branch pipe 68d operate together and the intake step, the compression step, the explosion step, and the exhaust step are carried out in the same phase. This burns the fuel to output the power. In the exhaust step, the high-temperature exhaust gas goes through the branch pipe 68b and the branch pipe 68d at a timing different from the aforementioned branch pipe 68a and branch pipe 68c.

On this occasion, the heat of the engine 66 is transmitted through the exhaust gas (heat medium). The internal temperature of the branch pipe 68b and the branch pipe 68d increases in the exhaust step and decreases in the other steps (the intake step, the compression step, the explosion step). The internal temperature increases or decreases over time in accordance with the piston cycle and the high-temperature state and the low-temperature state are repeated periodically.

The periodic temperature change of the branch pipes 68b and 68d and the periodic temperature change of the branch pipes 68a and 68c are the same in cycle but different in phase.

The power generation system 51 includes the sheet-shaped first device 53 disposed in each branch pipe 68 (in the box-shaped space 70).

Therefore, when the exhaust gas discharged from the engine 66 (heat source 52) has been introduced into the branch pipe 68 and the box-shaped space 70 has been filled with the gas, the front and rear surfaces of the first device 53

(and additionally, the peripheral surface thereof) are brought in contact with (exposed to) the exhaust gas (heat medium) (through the second device 54) and heated and/or cooled in the box-shaped space 70.

That is to say, both the front and rear surfaces of the first device 53 are heated and/or cooled by the temperature change of the engine 66 (heat source 52) and the heat medium that transmits the heat of the engine 66 over time.

This enables the first device 53 to be in the high-temperature state or the low-temperature state periodically. The first device 53 can be electrically polarized by the effect (for example, piezo effect or pyroelectric effect) in accordance with the element (for example, piezo element or pyroelectric element).

Thus, in the power generation system 51, the electric power can be extracted from the first device 53 through the second device 54 as the waveform that varies periodically (for example, alternating current or pulsating current).

In the power generation system 51, the temperature of the first device 53 is predicted by the temperature prediction program P stored in the memory 73 of the control unit 60 (see FIGS. 3 and 4).

If it is predicted that the temperature increase of the first device 53 will start, the central processing unit (CPU) 71 activates the voltage application device 59 to apply the predetermined voltage to the first device 53 at a timing earlier by a predetermined period than the predicted start time of the temperature increase.

If it is predicted that the temperature decrease of the first device 53 will start, the central processing unit (CPU) 71 deactivates the voltage application device 9 to stop the voltage application to the first device 53 at a timing earlier by a predetermined period than the predicted start time of the temperature decrease.

If the engine 66 of the internal-combustion engine 61 is used as the heat source 2, the first device 53 is heated and/or cooled by the internal-combustion engine in the power generation system 51. Therefore, the temperature of the first device 53 repeatedly increases or decreases without being maintained constant substantially.

In the power generation system 51, the voltage application device 59 is activated at the timing −15% or more and less than 0% of the cycle of the temperature change of the first device 53 from the predicted start time of the temperature increase. The voltage application device 59 is deactivated at a timing of −15% or more and less than 0% of the cycle from the predicted start time of the temperature decrease.

That is to say, in the power generation system according to one embodiment of the present invention, the voltage application device 59 is activated at a timing earlier by a predetermined period than the predicted start time of the temperature increase (−15% or more and less than 0% of the one temperature change cycle). The voltage application device 59 is deactivated at a timing earlier by a predetermined period than the predicted start time of the temperature decrease (−15% or more and less than 0% of the one temperature change cycle).

By activating and deactivating the voltage application device 59 at such timings, the electric power can be extracted efficiently from the first device 53, and the power generation efficiency can be improved.

In this method, the extracted electric power is boosted in the form of the waveform that varies periodically (for example, alternating current or pulsating current) in the booster 55 connected to the second device 54 as shown by a dotted line in FIG. 5. Next, the boosted electric power is converted into DC voltage in the AC/DC converter 56 and stored in the battery 57. The electric power stored in the battery 57 is used as a power for the automobile 75 and various electric components mounted in the automobile 75.

The exhaust gas having transmitted through the branch pipes 68 is supplied to the collection pipe 69 and collected therein. After that, the exhaust gas is supplied to the catalyst placement portion 62 and the gas is cleaned by the catalyst included in the catalyst placement portion 62. Then, the exhaust gas is supplied to the exhaust pipe 63 and the sound is reduced in the muffler 64. After that, the exhaust gas is discharged to the outside through the discharge pipe 65.

EXAMPLE

Next, the present invention is described based on the reference example. However, the present invention is not limited by the example below.

Reference Example 1

A bulk type piezo element (the first device with a silver electrode (second device) formed on each of front and rear surfaces, structure: PZT, Curie point (Tc): 295° C., relative dielectric constant: 2130, Product No.: C-6, FUJI CERAMICS CORPORATION) was cut into a sheet-like shape with a vertical length of 8 mm, a horizontal length of 13 mm, and a thickness of 0.5 mm.

Next, a 100-kΩ resistor was disposed in parallel to the piezo element. The resistor was provided to monitor the voltage continuously and calculate the generated electric power of the element based on the voltage value.

A heat gun was used as the heat source. The heat gun and the piezo element were disposed so that the injection port was set 3 cm apart from the piezo element.

Next, the thermocouple (temperature sensor) was disposed to detect the temperature of each sample. In order to apply voltage, the sample was held between the electrodes of the voltage application device (product number: MODEL 677B, TREK JAPAN). The voltage application power source and the control unit were electrically connected to each other.

The control unit (CPU) determines that the sample is in the temperature-increasing state when the temperature of the sample measured by the thermocouple has increased at 0.2° C./s or more and that the sample is in the temperature-decreasing state when this temperature has decreased at 0.2° C./s or more.

The temperature of the piezo element was increased or decreased over time by having the heat gun blow out the hot air and blocking between the heat gun and the piezo element with a metal plate regularly. The heating and cooling were switched at a cycle of heat/cool=1 second/1 second, i.e., in a cycle of a total of 2 seconds.

The temperature (average value) of the piezo element was measured with a thermocouple. The voltage was applied to the piezo element (intensity of electric field: 0.25 kV/mm) 0.2 seconds before the timing at which the temperature of the piezo element was increased, specifically the timing at which the cooling was switched to the heating (1.8 seconds after the start of the temperature increase (90% of the 2-second cycle)). The voltage application was stopped 0.2 seconds before the timing at which the temperature of the piezo element was decreased, specifically the timing at which the heating was switched to the cooling (1.8 seconds after the start of the temperature decrease (90% of the 2-second cycle)).

This made the piezo element electrically polarized and enabled the extraction of the power generation voltage (electric power) through the electrodes and the conductive wire.

The timing of the voltage application and the stop of voltage application was changed by every 0.1 seconds and the electric power was extracted similarly.

Figure 7:
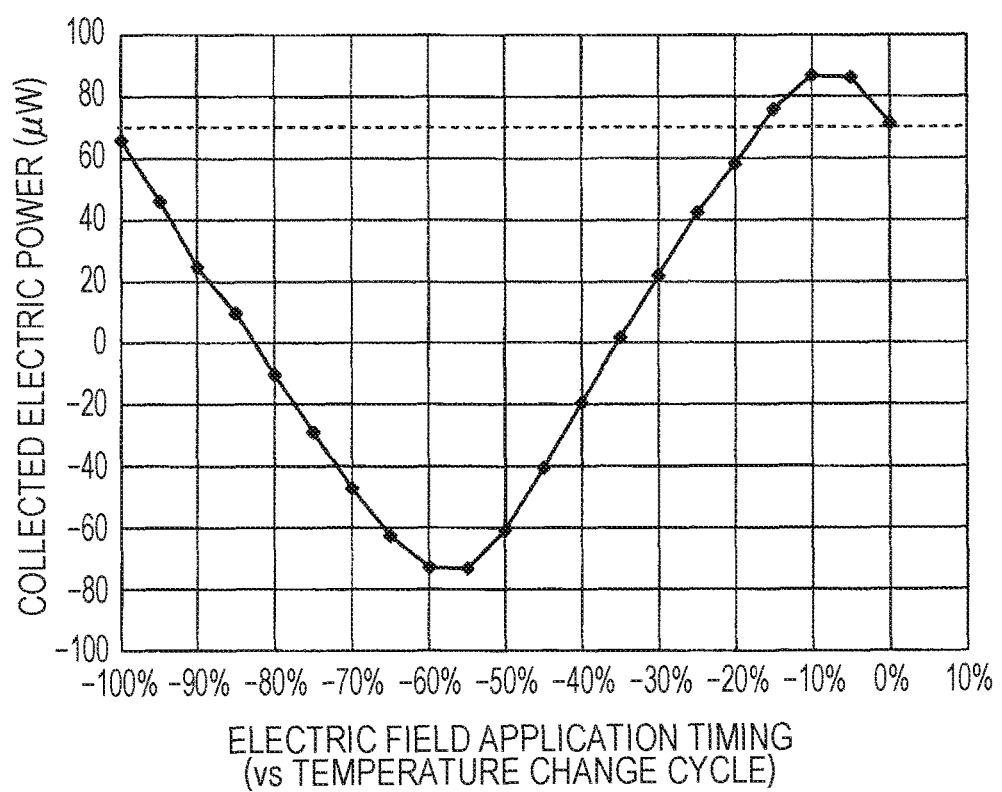
FIG. 7 is a graph expressing the relation between the timing of the voltage application and the collected electric power in a reference example.

FIG. 7 is the graph expressing the relation between the timing of the voltage application and the collected electric power. The collected electric power refers to the value obtained by subtracting the electric power used in the voltage application from the electric power generated by the piezo element.

This application claims priority from Japanese Patent Application No. 2013-241757 filed with the Japan Patent Office on Nov. 22, 2013 and Japanese Patent Application No. 2013-241562 filed with the Japan Patent Office on Nov. 22, 2013, the entire content of which is hereby incorporated by reference.

The foregoing detailed description on the particular embodiments of the present invention has been presented for the purposes of illustration. It is not intended to be exhaustive or to limit the subject matter described herein to the precise form disclosed. It is apparent to those skilled in the art that many modifications and variations are possible in light of the above teaching.

DESCRIPTION OF REFERENCE SIGNS

1 Power generation system
2 Power system
3 Power generation element
4 First electrode
5 Box-shaped container
6 Power generation device
7 Temperature detection device
9 Voltage application device
10 Control device
11 Engine
17 Exhaust pipe
29 Energy collection system
35 Temperature detection element
36 Second electrode
37 Voltage application electrode
51 Power generation system
52 Heat source
53 First device
54 Second device
55 Booster
56 AC/DC converter
57 Battery
59 Voltage application device
60 Control unit

The invention claimed is:

1. A power generation system comprising:
a heat source having a temperature being increased or decreased over time, said heat source comprising a multi-cylinder engine;
a flow passage through which a heat medium heated by the heat source passes;
a power generation device including a power generation element and a first electrode, a temperature of the power generation element being increased or decreased over time depending on temperature change of the heat medium, the power generation element being electrically polarized by the temperature increase or decrease thereof, the power generation element including a dielectric with the Curie point, the first electrode extracting electric power from the power generation element;
a temperature detection unit that is disposed on an upstream side relative to the power generation device in the flow passage and detects a temperature of the heat medium passing through the flow passage;
a voltage application unit that applies voltage to the power generation device; and
a control unit that activates the voltage application unit when the temperature detection unit has detected a temperature increase of the heat medium and deactivates the voltage application unit when the temperature detection unit has detected a temperature decrease of the heat medium,
the temperature detection unit including:
a temperature detection element, a temperature of the temperature detection element being increased or decreased over time depending on the temperature change of the heat medium, the temperature detection element being electrically polarized by the temperature increase or decrease thereof, the temperature detection element including a dielectric with the Curie point that is equal to the Curie point of the power generation element; and
a second electrode that detects electric polarization of the temperature detection element by detecting an electromotive force from the temperature detection element,
wherein the power generation element and the temperature detection element are provided within a plurality of branch pipes connected to cylinders of the engine.

* * * * *

UNITED STATES PATENT AND TRADEMARK OFFICE
CERTIFICATE OF CORRECTION

PATENT NO. : 10,283,692 B2
APPLICATION NO. : 15/037395
DATED : May 7, 2019
INVENTOR(S) : Satoru Yamanaka et al.

Page 1 of 1

It is certified that error appears in the above-identified patent and that said Letters Patent is hereby corrected as shown below:

On the Title Page

Item (73) Assignees, should read --DAIHATSU MOTOR CO., LTD., Osaka (JP); NATIONAL UNIVERSITY CORPORATION NAGAOKA UNIVERSITY OF TECHNOLOGY, Niigata (JP)--.

Signed and Sealed this
Thirtieth Day of July, 2019

Andrei Iancu
*Director of the United States Patent and Trademark Office*